(12) United States Patent
Hahn et al.

(10) Patent No.: US 7,009,398 B2
(45) Date of Patent: Mar. 7, 2006

(54) PORTABLE MAGNETIC RESONANCE SURFACE COIL UNIT WITH AN ACCESS OPENING FOR MANUAL GRIPPING

(75) Inventors: Heinz Hahn, Möhrendorf (DE); Volker Matschl, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/804,682

(22) Filed: Mar. 19, 2004

(65) Prior Publication Data
US 2004/0257081 A1    Dec. 23, 2004

(30) Foreign Application Priority Data
Mar. 20, 2003    (DE)    ................................. 103 12 451
Feb. 9, 2004     (DE)    ................. 10 2004 006 286

(51) Int. Cl.
*G01V 3/00*    (2006.01)

(52) U.S. Cl. ..................................................... 324/318

(58) Field of Classification Search ................ 324/307, 324/309, 318; 600/422, 410; 333/219
See application file for complete search history.

(56) References Cited

U.S. PATENT DOCUMENTS

| | | | |
|---|---|---|---|
| 5,363,845 A | | 11/1994 | Chowdbury et al. |
| 6,023,166 A | | 2/2000 | Eydelman |
| 6,157,193 A | | 12/2000 | Renz et al. |
| 6,163,717 A | | 12/2000 | Su |
| 6,323,648 B1 * | | 11/2001 | Belt et al. .................... 324/322 |
| 6,577,888 B1 * | | 6/2003 | Chan et al. ................. 600/422 |
| 6,591,128 B1 * | | 7/2003 | Wu et al. .................... 600/422 |
| 6,777,936 B1 * | | 8/2004 | Schaaf ........................ 324/318 |

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

A magnetic resonance surface coil unit has at least one magnetic resonance coil surrounded by a closed housing wherein the housing has at least one recessed grip, and the recessed grip is formed by an oblong access opening to the cavity arranged inside of the housing. The cavity extends behind the access opening to one side in the direction of a shorter dimension of the access opening, such that a region of the housing bordering the access opening forms a grip part of the recessed grip. The recessed grip can be arranged in a region surrounded by a magnetic resonance coil.

15 Claims, 2 Drawing Sheets

PORTABLE MAGNETIC RESONANCE SURFACE COIL UNIT WITH AN ACCESS OPENING FOR MANUAL GRIPPING

BACKGROUND OF THE INVENTION

1. Field of the Invention

The present invention concerns a magnetic resonance surface coil unit with at least one magnetic resonance resonator.

2. Description of the Prior Art

Examinations with a magnetic resonance device (MR device) today can extend over larger regions of the human body. The MR exposures necessary for this are mostly acquired with MR surface coil units. These completely cover the body section to be examined. As the examination region increases, MR surface coil units become ever larger, heavier and unwieldy.

An example of such an MR surface coil is a spinal column coil, the length of which corresponds to the entire length (approximately 1.20 m) of the human spinal column and the width of which is for the most part given by the width of the patient support (approximately 0.50 m), i.e. the width of the human upper body. A weight of approximately 12 kg results based on this size. Handling of this spinal column coil is cumbersome.

An MR imaging system is known from the German Patent 197 51 017, with a galvanically insulated coil element that has at least one free access region for a mechanical engagement in the area to be examined, in particular for an operation or for a biopsy.

Coils for MR mammography (breast coils) comprise examination regions adapted to the anatomy of the breast. Thus, a breast coil is known from U.S. Pat. No. 6,023,166 that has two partially freely accessible coil windings. A further breast coil is known from U.S. Pat. No. 5,363,845 that has two cylinder coils separated from one another. Furthermore, a breast coil with an open structure is known from U.S. Pat. No. 6,163,717 that has a flat base and an upper, biplanar section with two coil arrangements, borne on vertical legs.

Depending on the MR examination to be implemented, a suitable MR surface coil unit is used. It must be brought from a storage location to the MR device and positioned there. A spinal column coil is placed, for example, on a patient bed of the MR device. If another body region is then to be examined (scanned), the spinal column coil must be removed and, for example, a breast coil must be positioned.

SUMMARY OF THE INVENTION

An object of the present invention is to simplify the handling of an MR surface coil unit.

This object is inventively achieved by a magnetic resonance surface coil unit with at least one magnetic resonance coil surrounded by a closed housing, wherein the housing has at least one recessed grip and the recessed grip is formed by at least one cavity within the housing, the cavity extending behind an access opening at one side of the housing in the direction of a smaller dimension of the access opening, such that a region of the housing adjacent to the access opening forms a grip part of the recessed grip.

The recessed grip is fashioned for gripping the MR surface coil unit, i.e. it enables gripping, lifting and/or carrying of the MR surface coil unit. This has the advantage that a spinal column coil unit (that, for example, can be laterally integrated flush In a patient bed and therefore, in the examination-ready state, can be gripped only at the head and/or foot end) can be accepted by the patient bed with minimal physical strain, i.e. its handling is significantly simplified. An ergonomically shaped and advantageously positioned recessed grip enables operating personnel, many of whom are female, to easily grip and transport the MR surface coil unit to an MR device.

More than one such grip can be provided per surface coil.

The cavity enables gripping of the grip part directly in a closed housings that, for example, lie flush on a U-shaped patient bed. For example, fingers of a hand can grip the grip part via the oblong access opening fashioned, for example, to the size of the diameter of a hand. The grip part is formed by the housing adjacent to the access opening. The recessed grip with the grip part is preferably integrated into the housing, such that optimally no convexities result that could affect the comfort of the patient. The dimension of the access opening is kept as small as possible, so that although the grip is optimally good, at the same time the supporting surface of the patient on the MR surface coil unit is not affected.

The implementation of the recessed grip with a cavity in the MR surface coil unit has the advantage that the recessed grip is structurally integrated into the unit, such that the MR surface coil unit has no protuberance that could be disturbing to a patient.

In an embodiment, a wall of the cavity forms the grip part. It is reinforced with regard to its stability for compensation of the force exerted by the fingers upon gripping, lifting and/or carrying.

In another embodiment, the magnetic resonance coil is assembled as a coil array, that has a number of coils, and the cavity is at least partially arranged in a region surrounded one of the coils of the array. This arrangement has the advantage that the grip part can be integrated into the interior of an MR surface coil unit, since the region within the coil of the array is for the most part not otherwise used.

In a further embodiment, the recessed grip is disposed optimally close to the center of gravity of the magnetic resonance surface coil unit. This has the advantage that a possible torque created upon lifting the MR surface coil unit is reduced.

In another embodiment, the recessed grip is disposed optimally close to an edge of the MR surface coil unit. This has the advantage that the recessed grip is easily accessible.

In another embodiment, the MR surface coil unit is discshaped, and the recessed grip arranged is arranged on a longer side of the MR surface coil unit, preferably at the height of the center of gravity. This has the advantage that the torque upon lifting is reduced, and that the torque can be counteracted with a second recessed grip that is arranged symmetric to the first with regard to the center of gravity. The need for symmetry results, for example, from the recessed grips being arranged in regions surrounded by array coils. The freedom in the selection of a location for the application of a recessed grip is thereby limited and, for example, the best possible alternative to a symmetric arrangement of the recessed grip is selected.

DESCRIPTION OF THE PREFERRED EMBODIMENTS

Figure 1:
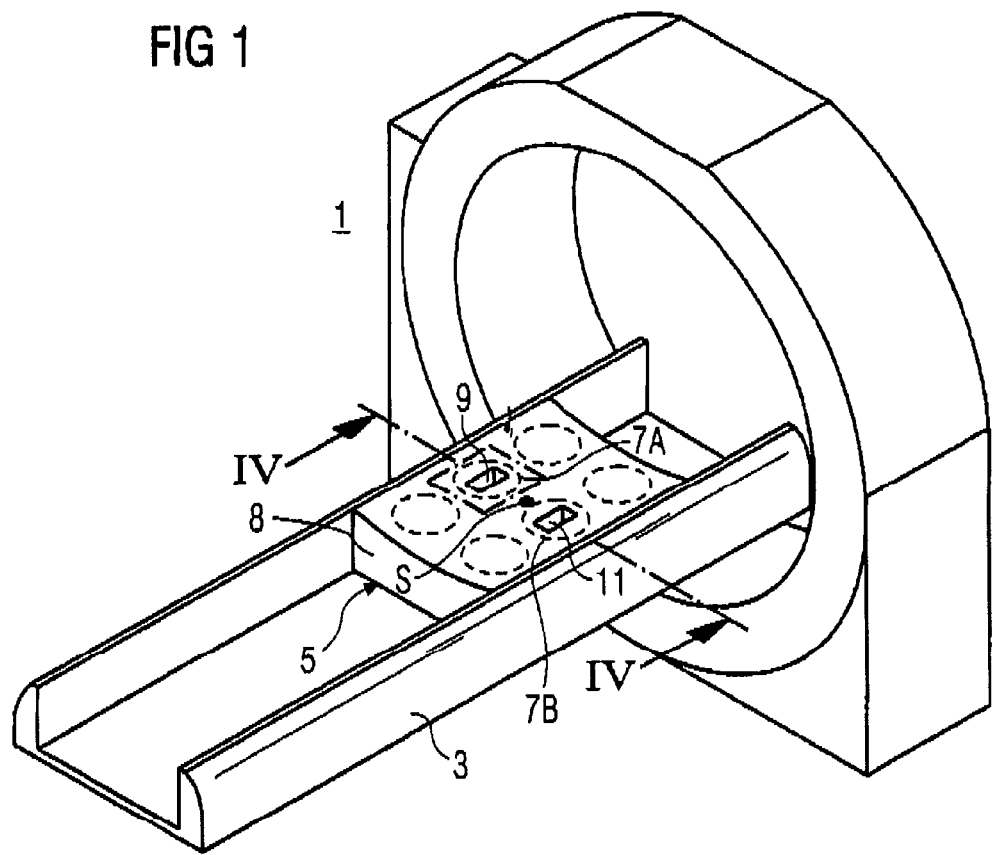
FIG. 1 shows an MR device in which a spinal column coil unit in accordance with the invention is positioned on a patient bed.

FIG. 1 shows an MR device 1 with a patient bed 3 on which a spinal column coil unit 5 is placed. The spinal column coil unit 5 is formed as a coil array that has a number of array coils 7A, 7B that provide an MR reception signal from which, for example, a spinal column exposure can be generated. The spinal column coil unit 5 has a length of approximately 1.20 m, a width of approximately 50 cm and a thickness of a few centimeters. It has an essentially closed housing 8 that is, for example, concave in the support region. At the edges, it fits flush to the patient bed 3 that is U-shaped. Two recessed grips 9, 11 are arranged on opposite sides of the spinal column coil unit 5 at the height of the center of gravity S. Each has an access opening to a cavity which is located in the region surrounded by one of the array coils 7A, 7B. If, for example, the spinal column coil unit 5 weighing approximately 12 kg is to be taken from the patient bed 3, the operating personnel can act with each hand on the grip parts 25A. 25B of the recessed grips 9, 11, take the spinal column coil unit 5 down from the patient bed, and bring it to its storage location.

Figure 2:
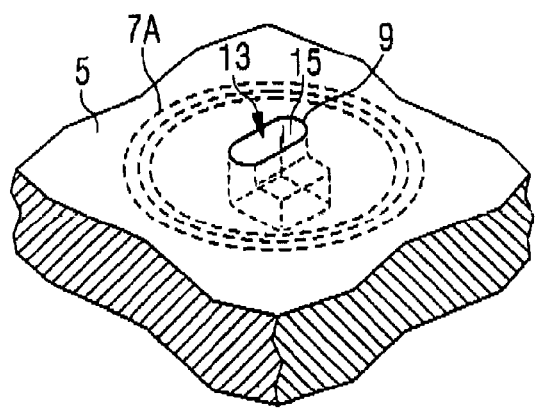
FIG. 2 is a view from above of a portion of the recessed grips of FIG. 1.

FIG. 2 shows a portion of the coil unit 5 of FIG. 1 containing the array coil 7A, in which the ergonomically shaped recessed grip 9 is shown in detail. An opening 13 can be seen in the form of an oblong hole that enables access to a trough-shaped cavity 15. The cavity 15 is disposed in the inner region of the array coil 7A. An angular shape of the cavity 15, with rounded edges and corners, results due to the opening 13. The wall of the cavity 15 (that at the same time forms the surface of the spinal column coil unit 5) bordering the opening 13 is fashioned with regard to its stability such that it forms a grip part and enables a lifting and transportation of the spinal column coil unit 5.

Figure 3:
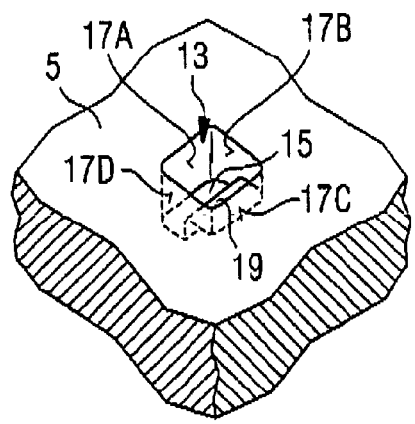
FIG. 3 is a view from below the portion of one of the recessed grips of FIG. 1.

FIG. 3 shows, in a view from below, the region of the spinal column coil unit 5 shown in FIG. 2 around the recessed grip 9. The cavity 15 is closed on the bottom of the spinal column coil unit 5, wherein the base has not been shown in order to enable a view into the cavity 15. In FIG. 3, the sidewalls 17A, 17B, 17C and 17D of the cavity 15 can be seen, as well as the bottom of the upper wall 19 (reinforced) of the cavity 15. In an embodiment of the recessed grip 11, the base of the cavity 15 is not present, such that a through hole through the spinal column coil unit 5 results together with the opening 13.

Figure 4:
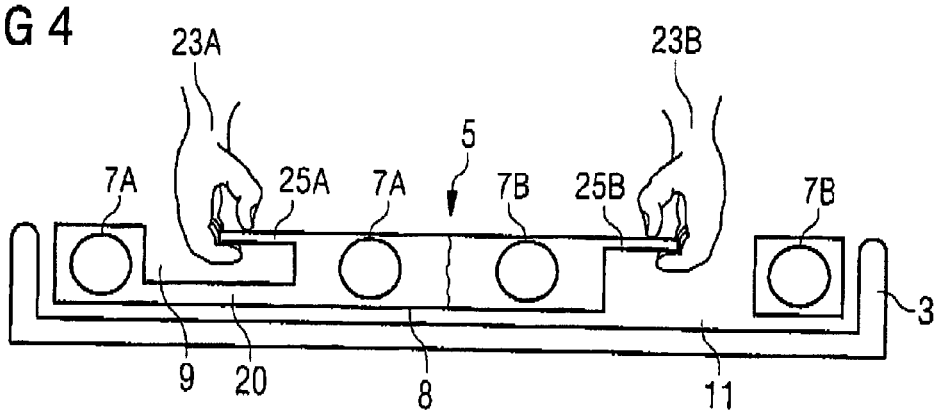
FIG. 4 is a section through the spinal column coil unit of FIG. 1 taken along line IV—IV at the height of the recessed grips.

FIG. 4 shows a section through the spinal column coil unit 5, through both recessed grips 9 and 11. Each recessed grip 9, 11 has an access opening via the closed housing 8 to a cavity disposed within the housing 8. The cavity extends, in connection to the inner width, at least in a direction of a short expansion of the access opening. The housing 8 connecting to the oblong access opening thereby forms a wall of the cavity on at least one side. The edges of the access opening are preferably rounded for comfortable carrying. The recessed grips 9, 11 are structurally integrated into the housing, such that the fingers of hands 23A, 23B can grip the recessed grips 9, 11. The grip parts 25A, 25B are formed by the housing 8 in the region in which the housing 8 forms a wall of the cavity. In this region, the housing 8 acting as a grip part 25A, 25B is fashioned such that it resists the force caused by the fingers and thus enables transport.

The through hole of the recessed grip 11 is clearly recognizable in the section. In contrast to this, the cavity of the recessed grip 9 exhibits a base 20. This has the advantage that pinching the fingers upon storing and lifting the spinal column coil unit 5 is prevented. In contrast to this, the recessed grip 11 can be used for carrying the spinal column coil unit 5 (see FIG. 7)

Figure 5:
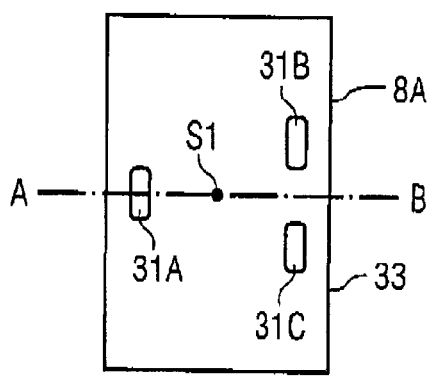
FIG. 5 shows an arrangement of three recessed grips on an MR surface coil unit in accordance with the invention.

FIG. 5 shows a particularly ergonomic arrangement of three recessed grips 31A, 31B, 31C in an MR surface coil unit 33 with a housing 8A. The recessed grips 31B, 31C are arranged mirror-symmetric on line AB through the center of gravity S1 of the MR surface coil unit 33. The arrangement of the recessed grips 31A, 31B, 31C can ensue depending on the design of the MR surface coil unit 33 inside of and/or outside of the local coil(s). The recessed grip 31A is arranged on the line AB at the edge of the MR surface coil unit 33. This arrangement enables an ergonomic use of the recessed grips 31A, 31B, 31C by both left-handed person and right-handed persons, and the recessed grips arranged offset from one another enables an interception of a tilting or turning moment given handling.

Figure 6:
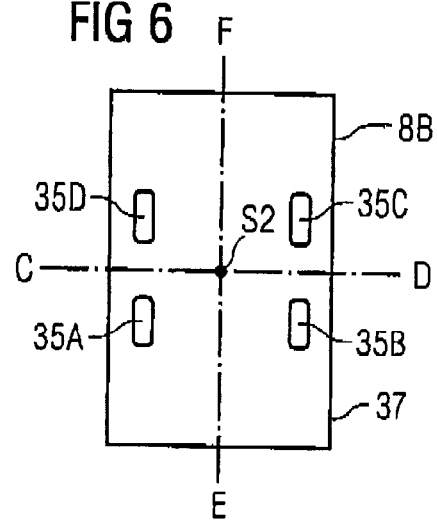
FIG. 6 shows an arrangement of four recessed grips on an MR surface coil unit in accordance with the invention.

FIG. 6 shows an embodiment with four recessed grips 35A, 35B. 35C, 35D that enable an ergonomic handling by left-handed persons and right-handed persons, and the handling is not dependent on the side from which the operating personnel has access to the MR surface coil unit 37. Depending on this, for example, the diagonally situated recessed grips 35A and 35B, 35C and 35D, are used. The recessed grips 35A, 35B, 35C, 35D are arranged mirror-symmetrically in pairs on the lines AB and EF that run through the center of gravity S2. It is also be considered here that, due to the respective position of the array coils in the housing 8B, the symmetry can be realized only in a limited manner. It can be more advantageous to arrange two somewhat offset recessed grips on one side and three somewhat offset recessed grips on the other side.

Figure 7:
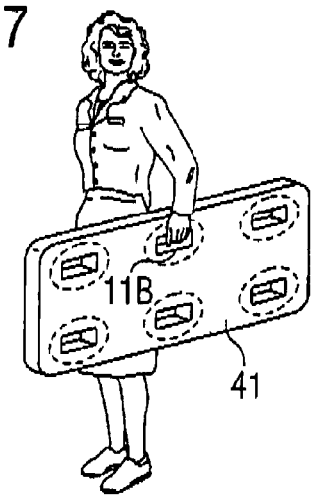
FIG. 7 illustrates a manner of use of a recessed grip for carrying an MR surface coil unit in accordance with the invention.

FIG. 7 shows the use of a recessed grip 11B for carrying an MR surface coil unit 41 in the manner of a briefcase. It is particularly advantageous when the recessed grip 11B is implemented as a through-recessed grip, i.e. as a through hole.

Examples of further oversized, larger and heavier coil units are a peripheral angio coil unit and a whole-body coil unit with approximately 10 kg per, or a breast coil unit with approximately 8 kg.

Although modifications and changes may be suggested by those skilled in the art, it is the intention of the inventors to embody within the patent warranted hereon all changes and modifications as reasonably and properly come within the scope of their contribution to the art.

We claim:

1. A magnetic resonance surface coil unit comprising:
   a magnetic resonance resonator coil;
   a completely closed housing surrounding said coil; and
   a recessed grip in said housing formed by an access opening in a surface of said housing communicating with a cavity disposed in an interior of said housing, said access opening having an oblong shape with a first dimension and a second dimension that is shorter than said first dimension, said first and second dimensions conforming in size tom and not substantially exceeding a size of, an adult human hand, and said cavity extending in said housing to at least one side of said access opening in a direction of said second dimension, forming a gripper part in a region of said housing next to said access opening, structurally integrated with said closed housing to allow manual lifting of said closed housing using said gripper part.

2. A magnetic resonance surface coil unit as claimed in claim 1 comprising structural reinforcement in said region of said housing forming said gripper part.

3. A magnetic resonance surface coil unit as claimed in claim 1 wherein said first and second dimensions of said access opening are dimensioned to allow insertion of a plurality of fingers of a human hand.

4. A magnetic resonance surface coil unit as claimed in claim 1 wherein said housing has a housing side adapted to be accessible in an installed state of the magnetic resonance surface coil unit, and wherein said access opening is disposed at said housing side.

5. A magnetic resonance surface coil unit as claimed in claim 1 further comprising a second access opening in communication with said cavity, said first and second access openings and said cavity forming a passage extending completely through said housing.

6. A magnetic resonance surface coil unit as claimed in claim 1 wherein said coil at least partially surrounds said region of said housing forming said gripper part.

7. A magnetic resonance surface coil unit as claimed in claim 1 comprising a coil array formed by a plurality of magnetic resonance resonator coils, including said magnetic resonance resonator coil, and wherein one of said magnetic resonance resonator coils in said plurality at least partially surrounds said region of said housing forming said gripper part.

8. A magnetic resonance surface coil unit as claimed in claim 1 wherein said housing has a center of gravity, and wherein said recessed grip is disposed substantially at said center of gravity.

9. A magnetic resonance surface coil unit as claimed in claim 1 wherein said housing has an edge, and wherein said recessed grip is disposed next to said edge.

10. A magnetic resonance surface coil unit as claimed in claim 1 wherein said housing has a rectangular shape with a shorter side and a longer side, and wherein said recessed grip is disposed at said longer side.

11. A magnetic resonance surface coil unit as claimed in claim 10 wherein said housing has a center of gravity disposed at a height within said housing, and wherein said recessed grip is disposed at said height of said center of gravity.

12. A magnetic resonance surface coil unit as claimed in claim 1 wherein said housing has a center of gravity and wherein said recessed grip is a first recessed grip, and comprising a second recessed grip, said first and second recessed grips being disposed symmetrically relative to said center of gravity.

13. A magnetic resonance surface coil unit as claimed in claim 12 wherein said first and second recessed grips form a first pair of recessed grips, and comprising a third recessed grip and a fourth recessed grip forming a second pair of recessed grips, said first and second pairs of recessed grips being disposed mirror symmetrically to each other.

14. A magnetic resonance surface coil unit as claimed in claim 13 wherein said housing has an edge, and wherein said first and second pairs of recessed grips are disposed relative to an access of symmetry defined by a shortest line connecting said center of gravity with said edge.

15. A magnetic resonance surface coil unit as claimed in claim 1 wherein said housing has first and second opposite edges and wherein said recessed grip is a first recessed grip, and comprising a second recessed grip and a third recessed grip, said first and second recessed grips being disposed at said first edge and said third recessed grip being disposed at said second edge.

\* \* \* \* \*